United States Patent
Docter et al.

(10) Patent No.: US 6,897,132 B2
(45) Date of Patent: May 24, 2005

(54) METHOD OF REDUCING THE CONDUCTIVITY OF A SEMICONDUCTOR AND DEVICES MADE THEREBY

(75) Inventors: Daniel P. Docter, Santa Monica, CA (US); Kursad Kiziloglu, Los Angeles, CA (US)

(73) Assignee: HRL Laboratories, LLC, Malibu, CA (US)

( * ) Notice: Subject to any disclaimer, the term of this patent is extended or adjusted under 35 U.S.C. 154(b) by 214 days.

(21) Appl. No.: 10/200,804

(22) Filed: Jul. 22, 2002

(65) Prior Publication Data

US 2003/0040170 A1 Feb. 27, 2003

Related U.S. Application Data

(62) Division of application No. 09/354,248, filed on Jul. 15, 1999, now Pat. No. 6,444,552.

(51) Int. Cl.[7] .............................................. H01L 21/22
(52) U.S. Cl. ........................ 438/542; 436/167; 436/174; 436/510
(58) Field of Search ............................ 257/194, 20, 24, 257/E21.403, E21.407, E29.246, E29.248, E29.251, E29.252; 438/167, 172, 510, 522, 48, 189, 570, 279

(56) References Cited

U.S. PATENT DOCUMENTS

| | | | | |
|---|---|---|---|---|
| 4,452,646 A | * | 6/1984 | Zuleeg ........................ 438/194 |
| 4,544,799 A | * | 10/1985 | Barnett ........................ 136/262 |
| 4,714,948 A | * | 12/1987 | Mimura et al. .............. 257/194 |
| 5,322,808 A | * | 6/1994 | Brown et al. ................ 117/105 |
| 5,536,967 A | * | 7/1996 | Yokoyama ................... 257/485 |
| 6,242,293 B1 | * | 6/2001 | Danzilio ...................... 438/172 |
| 6,248,666 B1 | * | 6/2001 | Frijlink et al. .............. 438/689 |

FOREIGN PATENT DOCUMENTS

| | | | | |
|---|---|---|---|---|
| GB | 2202086 | * | 2/1988 | ......... H01L/21/324 |
| JP | 357015418 | * | 1/1982 | ........... H01L/21/22 |
| JP | 359072765 | * | 4/1984 | ........... H01L/29/72 |

* cited by examiner

*Primary Examiner*—Long Pham
*Assistant Examiner*—Thao X. Le
(74) *Attorney, Agent, or Firm*—Ladas & Parry LLP

(57) ABSTRACT

Disclosed is a method of reducing the conductivity/charge of a layer of group III–V semiconductor doped with Sn. The method includes the steps of: forming an region of $SiO_2$ on the semiconductor layer; annealing at least the semiconductor layer and the region of $SiO_2$ at a temperature sufficiently high to cause atoms of the Sn dopant to leach from the semiconductor layer into the region of $SiO_2$; and removing the region of $SiO_2$ after the annealing step is performed. The method can be used, for example, during the manufacture of HEMT, PHEMT, MESFET and HBT devices.

8 Claims, 9 Drawing Sheets

| CONTACT | 14 |
| SCHOTTKY | 13 |
| CHANNEL | 12 |
| BUFFER | 11 |
| SUBTRATE | 10 |
FIG. 1a
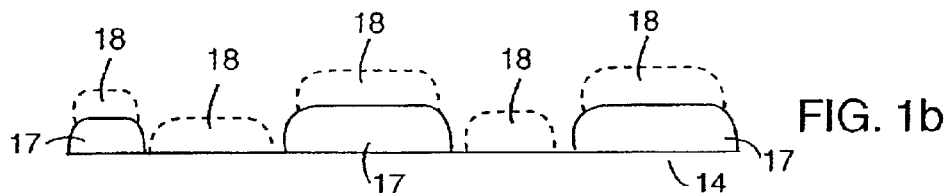
FIG. 1b
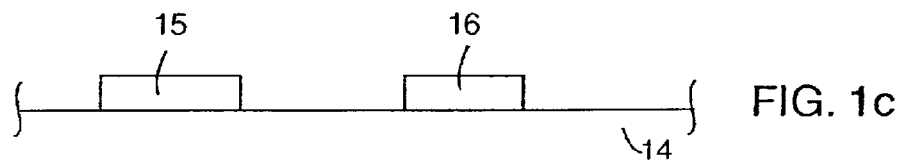
FIG. 1c
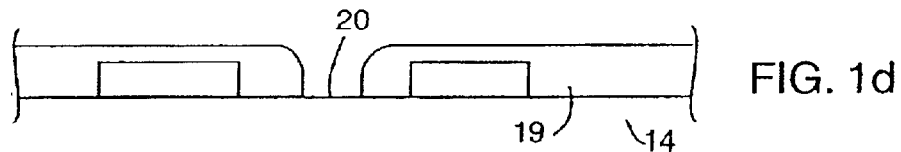
FIG. 1d
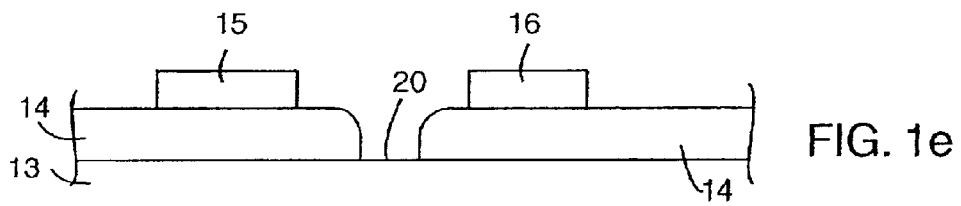
FIG. 1e
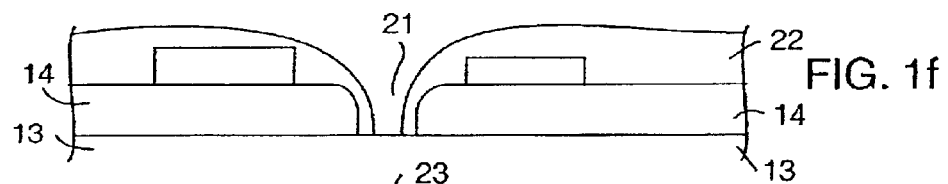
FIG. 1f
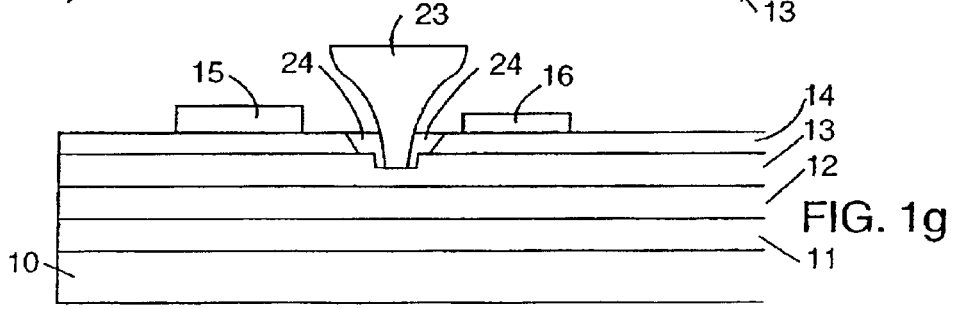
FIG. 1g
PRIOR ART

| LAYER | THICKNESS | S:D | Doping level | |
|---|---|---|---|---|
| contact layer | 300Å | GaAs:Sn | 5.00E+18 | — 14 |
| Schottky | 450Å | AlGaAs:ud | | — 13 |
| Delta doping | | Sn delta | 2.50E+12 | |
| AlGaAs spacer | 20Å | AlGaAs:ud | | |
| GaAs spacer | 10Å | GaAs:ud | | |
| channel | 120Å | InGaAS | | — 12 |
| GaAs spacer | 30Å | GaAs:ud | | |
| superlattice (4x) | 200Å | AlGaAs:ud | | x4 } 11 |
| GaAs/AlGaAs | 15Å | GaAs:ud | | |
| substrate | | GaAs:SI | | — 10 |

FIG. 4

Room temperature photoluminescence (PL) data from the as-grown and SiO2 encapsulated anneaded sample.

X-Ray data from the as-grown and SiO2 encapsulated annealed sample.

METHOD OF REDUCING THE CONDUCTIVITY OF A SEMICONDUCTOR AND DEVICES MADE THEREBY

This application is a division of application Ser. No. 09/354,248 filed Jul. 15, 1999, now U.S. Pat. No. 6,444,552.

FIELD OF THE INVENTION

The present invention relates to a method of reducing the conductivity (or charge) of a doped semiconductor. The method may be conveniently used in a number of applications. For example, the method may be used to effectively perform the channel or gate recess etches commonly used in Metal Semiconductor Field Effect Transistor (MESFET) devices and High Electron Mobility Transistor (HEMT) devices, including Pseudomorphic High Electron Mobility transistor (PHEMT) devices. The method may also be used to reduce the extrinsic base-collector capacitance in a semiconductor device As such the present invention also relates to devices manufactured according to this method.

DESCRIPTION OF THE PRIOR ART

A prior art HEMT device will now be described with reference to FIGS. 1A–1G. FIG. 1A depicts a substrate 10 having a buffer layer 11 disposed thereon which in turn has a channel layer 12 disposed thereon. On the channel layer is disposed a Schottky layer 13 and a contact layer 14 is formed on top of the Schottky layer. Each of these layers are conventional epitaxial layers formed by methods known in the prior art. Additionally, these layers are generally formed of semiconductor materials from groups III and V of the Periodic Table of Elements and their alloys. Semiconductor materials such as Gallium Arsenide (GaAs), Indium Phosphide (InP), and Aluminum Gallium Arsenide (AlGaAs), Indium Gallium Arsenide (InGaAs), Indium Aluminum Arsenide (InAlAs) are typically used in such devices. Since the alloys which are used and their level of dopings are known in the prior art, they are not described further here.

In order to form a field effect device in the structure shown in FIG. 1A, metal source and drain contacts 15 and 16 are formed on contact layer 14 (see FIG. 1C). This can be done by patterning a layer of photoresist 17, covering the patterned photoresist with metal 18 and, thereafter, lifting off the photoresist and the layer of metal disposed on top thereof in order to arrive at the structure shown in FIG. 1C. Those skilled in the art will realize, of course, that there are other ways of forming the source contact 15 and drain contact 16 shown in FIG. 1C.

Thereafter, another layer of photoresist 19 is applied and patterned as shown in FIG. 1D to expose an area 20 between the source contact 15 and the drain contact 16. The device is then etched with an etchant suitable to remove the exposed contact layer in area 20. This etch is called a gate recess etch. After the photoresist layer 19 is removed the structure shown in FIG. 1E results.

Sometimes HEMT, PHEMT and MESFET devices are subjected to a second etch. If a second etch is used, the structure of FIG. 1E is covered with a photoresist which is patterned to form a region in the exposed portion 20 of Schottky layer 13 as shown in FIG. 1F. The Schottky layer is subjected to a controlled etch which is called a channel recess etch. This particular etch is one of the most critical steps in the manufacture of prior art HEMT and PHEMT devices. The most common process used for the gate recess etch previously described with reference to FIGS. 1D and 1E and the channel recess etch previously described with reference to FIG. 1F is typically a wet chemical etch which removes device material to the desired depth in the gate area of the device. Typically, the channel etch is not monitored by depth, but rather by measuring the saturation current flowing from the source contact 15 to the drain contact 16 of exemplary HEMT devices being manufactured in a wafer. In manufacturing these devices, many devices are normally manufactured at the same time on a common semiconductor wafer and the saturation current is measured only for a few exemplary devices being formed on the wafer. Presumably, the devices which are measured are representative of all the devices being manufactured on the wafer. Of course, the exemplary devices may or may not be truly representative of all of the devices. In any event, as a channel recess etch proceeds, etching away the conductive material, the conductivity in the channel decreases and therefore the saturation current decreases. Typically, the measurement of the saturation current and the etch processing do not occur at the same time and therefore usually several cycles of etch processing and measuring are alternatingly utilized until the desired saturation current level is reached. After the channel recess etch has been completed, a gate structure 23 is formed and the patterned photoresist 22 is removed. If the Schottky layer 13 includes Aluminum in the alloy thereof, which is commonly the case, a passivation layer 24 is conventionally applied. It is undesirable to expose Aluminum containing compounds to atmosphere since Aluminum is very reactive and subject to oxidation. The passivation layer 24 helps protect against such oxidation.

It is an object of the present invention to provide a method of manufacturing HEMT-type devices having desired saturation current levels but without exposing Aluminum containing compounds of the Schottky layer 13 to atmosphere.

It is another object of the present invention to provide a method of manufacturing HEMT-type devices having desired saturation current levels but without requiring use of a passivation layer to cover Aluminum containing compounds on the gate area.

BRIEF DESCRIPTIONS OF THE INVENTION

In one aspect the present invention provides a method of reducing the conductivity of a layer of a group III–V semiconductor doped with a group IV semiconductor, the group III, IV and V semiconductors each having an atomic number with the atomic number of the group IV semiconductor being larger than the atomic numbers of each of the group III and group V semiconductors. The method comprising the steps of forming a region of $SiO_2$ on the group III–V semiconductor layer; and annealing at least the semiconductor layer and the region of $SiO_2$ at a temperature sufficiently high to cause atoms of the group IV semiconductor to leach from the semiconductor layer into the region of $SiO_2$. The region of $SiO_2$ is optionally removed after the annealing step is performed.

In another aspect, the present invention provides a method of forming a gate region of a semiconductor device such as a PHEMT or a HEMT or a MESFET device. The method includes the steps of (i) forming an layer of semiconductor layer doped with Sn; (ii) forming an region of $SiO_2$ on the semiconductor layer, the region of $SiO_2$ corresponding to the gate region to be formed; (iii) annealing at least the semiconductor layer and the region of $SiO_2$ at a temperature sufficiently high to cause atoms of the Sn dopant to leach from the semiconductor layer into the region of $SiO_2$ and to thereby form a region in said semiconductor layer having a reduced concentration of Sn dopant, the annealing step occurring at a temperature sufficiently low and for a period of time sufficiently short to inhibit significant intermixing between the region of $SiO_2$ and the semiconductor layer; (iv) optionally removing the region of $SiO_2$ after the annealing step is performed; and (v) forming a gate electrode on said semiconductor layer.

In yet another aspect the present invention provides a method of reducing base-collector capacitance of a semiconductor device having layer of a group III–V semiconductor which is doped with a group IV semiconductor. The method includes the steps of: forming a region of $SiO_2$ on the group III–V semiconductor layer; annealing at least the semiconductor layer and the region of $SiO_2$ at a temperature sufficiently high to cause atoms of the group IV semiconductor to leach from at least a region of the group III–V semiconductor layer into the region of $SiO_2$; removing the region of $SiO_2$ after the annealing step is performed; and forming a semiconductor layer defining a base region on the region of the group III–V semiconductor layer from which the IV semiconductor was leached.

BRIEF DESCRIPTION OF THE DRAWINGS

FIGS. 1A through 1G depict the steps in manufacturing a prior art HEMT device.

FIG. 4 depicts a semiconductor structure used for testing purposes;

DETAILED DESCRIPTION OF THE INVENTION

The invention is first described below with reference to the manufacture of a HEMT device in which an etch step is eliminated. However, the present invention may be used during the manufacture of other devices, including, for example, PHEMT, MESFET and/or HBT devices, and to gain this and/or other advantages, such as layer charge reduction. Other applications for the present invention are discussed after presenting certain experimental results which have been obtained.

An Improved HEMT Device

Figure 2A:
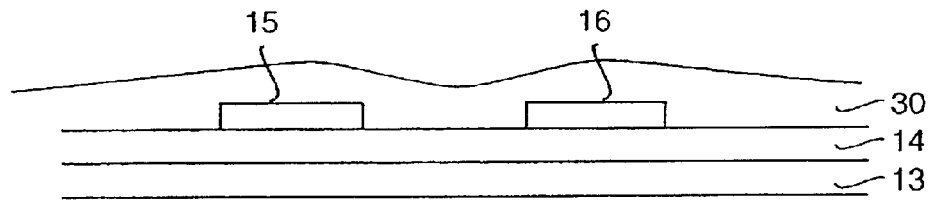
FIGS. 2A–2E depict the steps which may be used to define the channel (i.e., control the saturation current between the source and drain) without the need to expose any semiconductor compound which includes Aluminum to atmosphere and without the need to employ a passivation layer.

A HEMT device made in accordance with the present invention starts out with a layered structure such as that shown in FIG. 1A. Indeed, the process steps described with reference to FIGS. 1A–1C, may be utilized to arrive at the structure shown in FIG. 1C. Thereafter, instead of subjecting the contact layer to gate etch, which exposes the Aluminum bearing Schottky layer, a layer of $SiO_2$ is deposited over the structure shown in FIG. 1C so as to arrive at the structure shown in FIG. 2A.

Figure 2B:
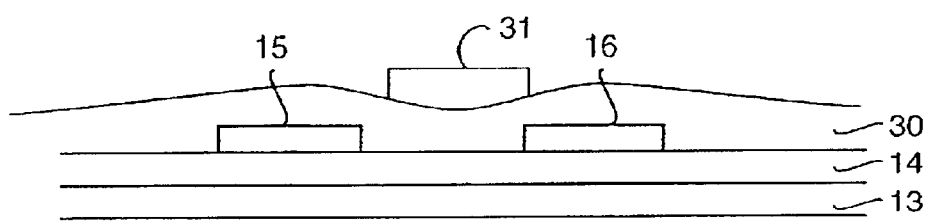
Figure 2C:
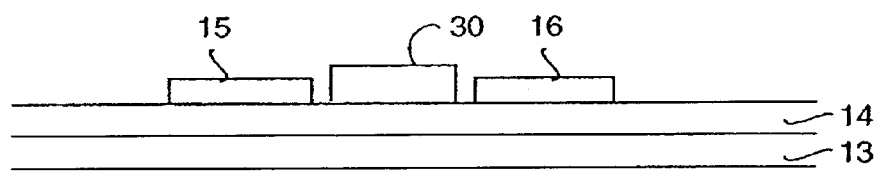

A layer of photoresist is then deposited on the layer of $SiO_2$ and the layer of photoresist is patterned using known photolithographic techniques, to leave an island of photoresist 31, as shown in FIG. 2B. The $SiO_2$ is then etched using the patterned layer (or island) of photoresist 31 as a mask. The patterned layer would typically include many islands 31 i.e, one for each device being manufactured. The masked portions of the layer of photoresist 31 are then removed to expose islands of $SiO_2$ disposed over a region in contact layer 14, as can be seen in FIG. 2C. In this embodiment, contact layer 14 preferably comprises a layer of Gallium Arsenide doped with Tin (Sn).

Figure 2D:
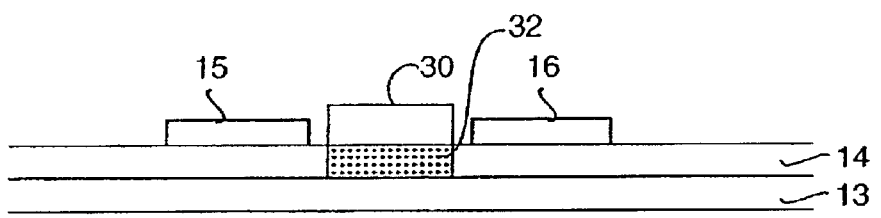

The structure shown in FIG. 2C is then subjected to an anneal. It has been discovered that the $SiO_2$ tends to leach the Sn dopant atoms out of the contact layer 14 during an anneal. This tends to reduce the resistivity of the contact layer in the region 32 thereof immediately below the patterned $SiO_2$ 30 (see FIG. 2D), which basically has the same effect as etching the contact layer 14 (which is a standard procedure for removing the effective charge in the channel or gate area). This anneal occurs at a relatively low temperature (approximately 600° C.) and the anneal time is relatively short (approximately 10 minutes or less).

Figure 2E:
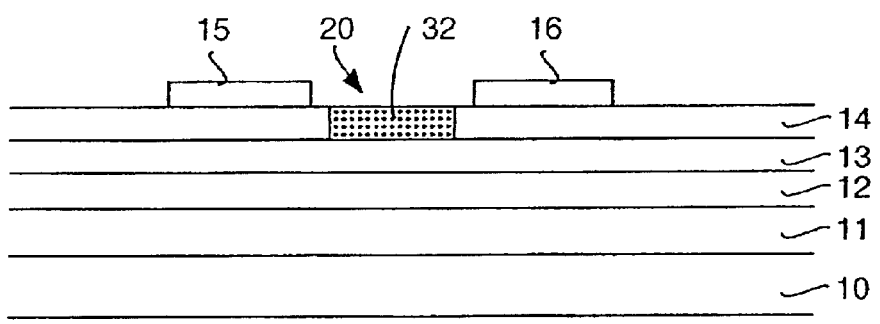

The remaining portion of the $SiO_2$ layer 30 is then preferably removed as shown in FIG. 2E to produce a contact layer 14 which continues to cover the Aluminum containing Schottky layer 13 fully, but the contact layer 14 has an area 32 of reduced conductivity below region 20 which will become the gate area.

If the MESFET, HEMT or PHEMT device is to be of a type similar to the doubly etched device discussed with reference to FIGS. 1A–1G, then the contact layer 14 will be etched in a manner analogous to that discussed with reference to FIG. 1G (the main difference being that the contact layer 14 is being etched as opposed to the Schottky layer 13). The structure shown in FIG. 3A will be arrived at after adding a gate 23.

Figure 3A:
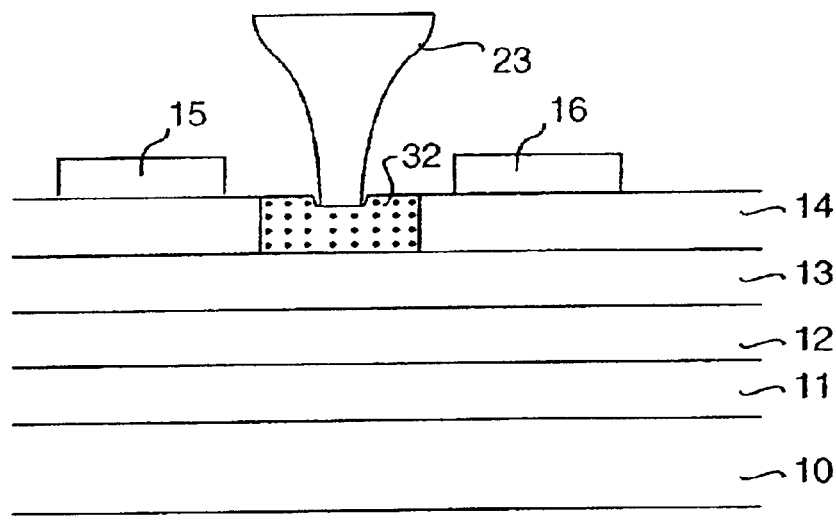
FIG. 3A shows the resulting structure after a partial physical etch of the contact layer and a gate has been added.
Figure 3B:
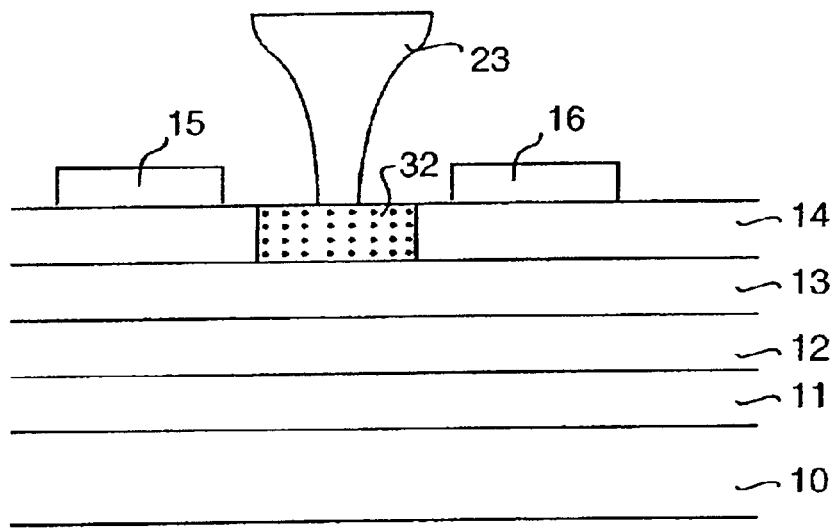
FIG. 3B shows the resulting structure a gate has been added (without physically etching the contact layer)

If the MESFET, HEMT or PHEMT device is analogous to a single etch device, then the contact layer 14 need not be physically etched and the device will assume the structure shown in FIG. 3B after a gate 23 has been added.

In any case, using the patterned $SiO_2$ layer 30 to leach the Sn dopant from the underlying contact layer 14 (i) permits an etch step to be eliminated and (ii) allows the contact layer to remain in place over the Schottky layer 13 thereby protecting Al, which is likely to exist in that layer, from the atmosphere. Thus using $SiO_2$ to leach the Sn from the contact layer 14 might be referred to as an "etchless" etch when used in this fashion.

The $SiO_2$ layer, after being used to leach the Sn dopant from the underlying semiconductor layer may be removed, as described above, or some practicing the present invention may prefer to retain at least a portion of the $SiO_2$ layer in place in the resulting semiconductor device. The retained $SiO_2$ could be used, for example, as a passivation layer or insulating layer in the device being manufactured.

Experimental Results

A semiconductor structure was experimentally grown, as is shown in FIG. 4. Tin (Sn) was used as the dopant in the contact layer 14. The layers are defined with the same reference numbers as used in the preceding figures. However the layers are shown in greater detail in that some layers have spacer layers between them or are themselves made up of multiple layers. FIG. 4 shows the semiconductor materials (S) used and the dopants (D) used, if any. Undoped layers are marked "ud".

After growth the semiconductor structure shown by FIG. 4 was cleaved into several test samples: (i) with $SiO_2$ deposition, (ii) with SiN deposition, and (iii) as grown for material characterization. The layer of $SiO_2$ 30 (FIG. 2A) was 1000 Å thick for the $SiO_2$ encapsulated samples. The samples of the semiconductor structure with $SiO_2$, SiN, and no dielectric encapsulation were put through a metal organic vapor plasma etch (MOVPE) regrowth cycle (i.e. with no regrowth, but simply an anneal step which is preferably carried out without breaking vacuum). The cycle was 10 minutes at 600° C. In one regrowth cycle (anneal), the samples were left exposed and in a second cycle a proximity cap was used by covering the samples with a GaAs wafer. After the anneals, Hall, photoluminescence (PL), X-ray, and SIMS tests were performed on the samples.

Hall results are set forth in Table I for the various samples. The Hall data shows that the resistivity ρ of the semiconductor of the $SiO_2$ encapsulated samples increases greatly while the samples encapsulated with SiN or having no dielectric show very little change. The Hall data shows that the reason for the increased resistivity is a significant decrease in free charge $n_S$. The increase in mobility $\mu$ demonstrates that the decrease in free charge comes from the contact layer 14 and not the channel layer 12. The Hall measurement measures total sample conductivity, and using that determines the total free charge and weighted average mobility. For the samples, there was conductivity in both the contact layer 14 and the channel layer 12. The contact layer 14 has low mobility, due to Sn impurity atoms that scatter electrons, and the channel layer 12 has high mobility, due to no impurities and the addition of In. The conductivity for each layer is proportional to the mobility*free charge product for that layer. So, if the charge in the contact layer (low mobility) decreases, its weighted contribution to the mobility decreases and the measured Hall mobility increases. Thus the charge depletion/removal must be occurring in the contact layer. In addition to the encapsulation and anneal experiments, it was determined that other aspects of the involved processing (such as exposure to the BOE etch used to remove the dielectrics after anneals) had negligible effect on the Hall data for the samples.

TABLE I

Hall Data for the experiment:

| Samples | ρ (Ω/sq) | $n_s$ (cm$^{-2}$) | $\mu$ (cm$^2$/Vs) |
| --- | --- | --- | --- |
| as grown - no anneal | 142 | $2.38 \cdot 10^{13}$ | 1841 |
| as grown - anneal with GaAs cover | 164 | $1.86 \cdot 10^{13}$ | 2053 |
| $SiO_2$ - anneal | 371 | $4.61 \cdot 10^{12}$ | 3658 |
| SiN - anneal | 167 | $1.71 \cdot 10^{13}$ | 2187 |
| $SiO_2$ - anneal with GaAs cover | 309 | $6.45 \cdot 10^{12}$ | 3137 |
| SiN - anneal with GaAs cover | 164 | $1.80 \cdot 10^{13}$ | 2110 |
| as grown - BOE dielectric etch | 147 | $2.27 \cdot 10^{13}$ | 1869 |

Figure 5:
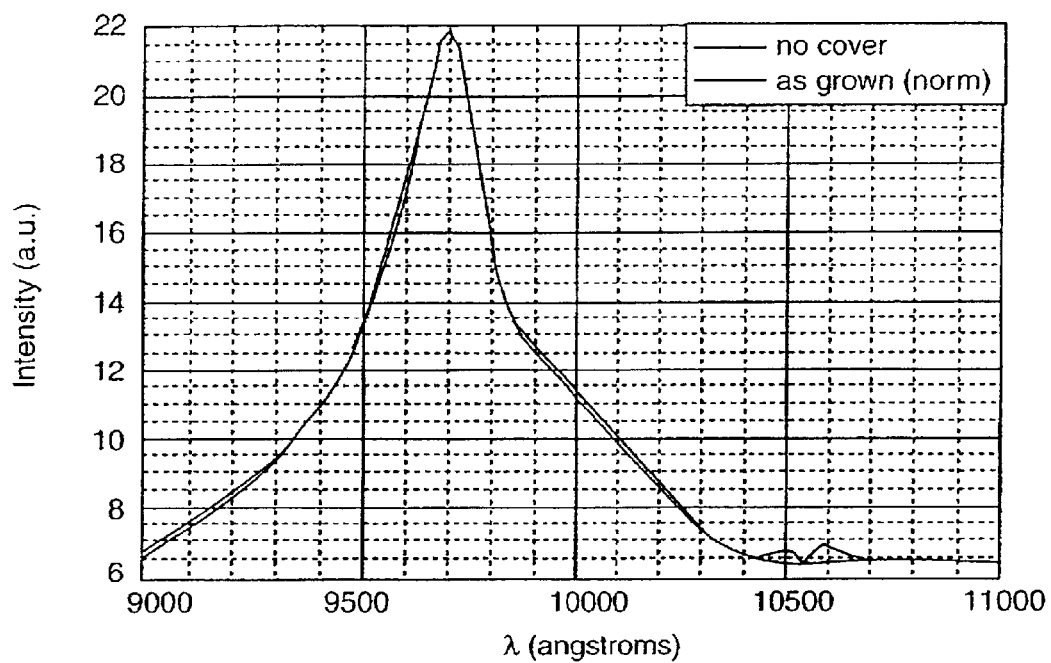
FIG. 5 shows room temperature photoluminescence data from as-grown and $SiO_2$ encapsulated, annealed samples of the structure shown in FIG. 4.

The room temperature PL data are shown in FIG. 5 for the as-grown sample and a $SiO_2$ encapsulated sample after anneal. The peak wavelength and the overall lines shape are nearly identical. The PL results verify that no intermixing associated with the InGaAs channel layer has occurred, and that the channel charge and charge distribution remains unchanged. These data support the Hall findings which indicate the charge loss occurs in the contact layer.

Figure 6:
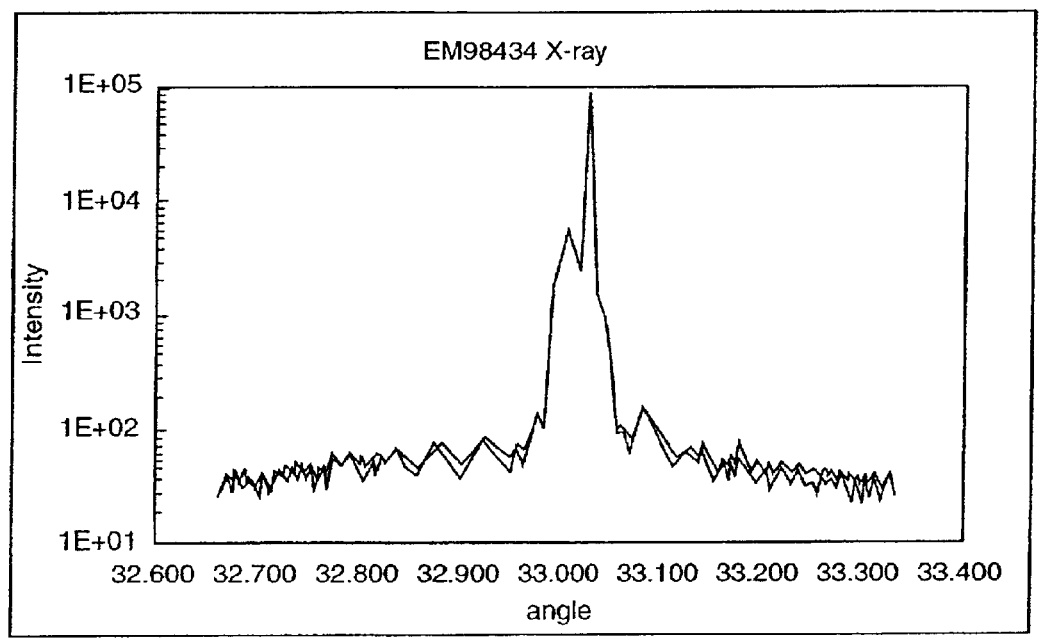
FIG. 6 shows X-ray data from as-grown and $SiO_2$ encapsulated, annealed samples of the structure shown in FIG. 4.

FIG. 6 shows X-ray data, again for the as-grown and $SiO_2$ encapsulated and annealed samples. The X ray lineshapes are also nearly identical, and verify that the measured Al composition of the Schottky layer 13 is the same for both samples. The X-ray data provide more evidence that no intermixing is occurring in these samples.

Figure 7A:
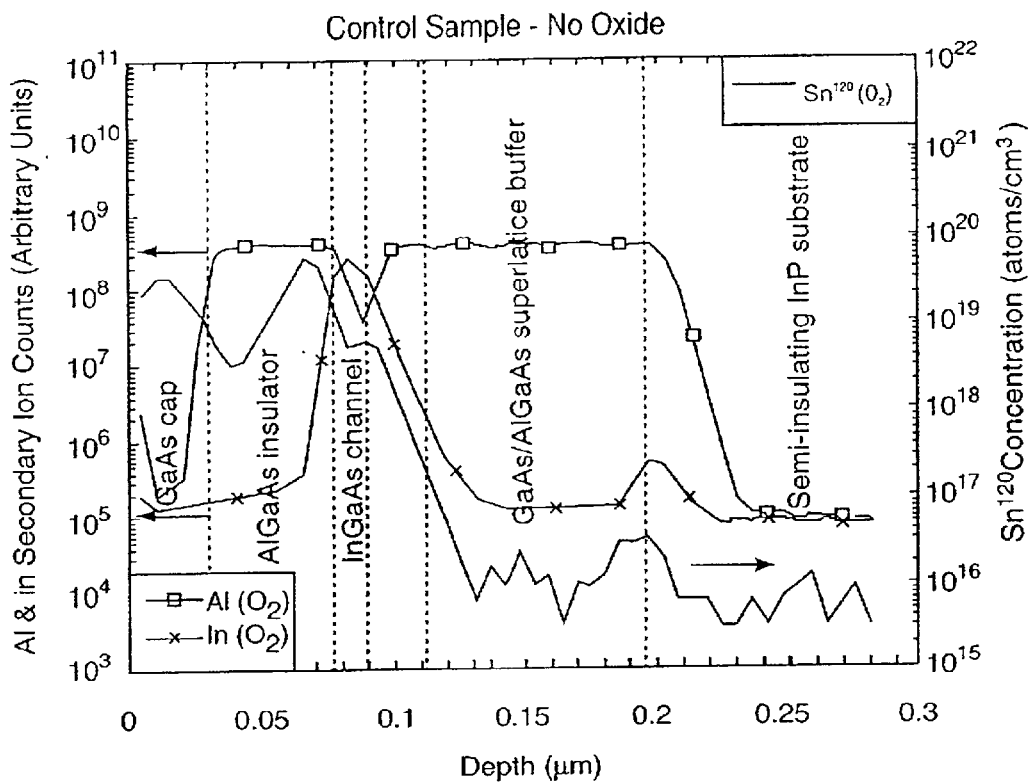
FIGS. 7A and 7B provide SIMS data from as-grown and $SiO_2$ encapsulated, annealed samples of the structure shown in FIG. 4.
Figure 7B:
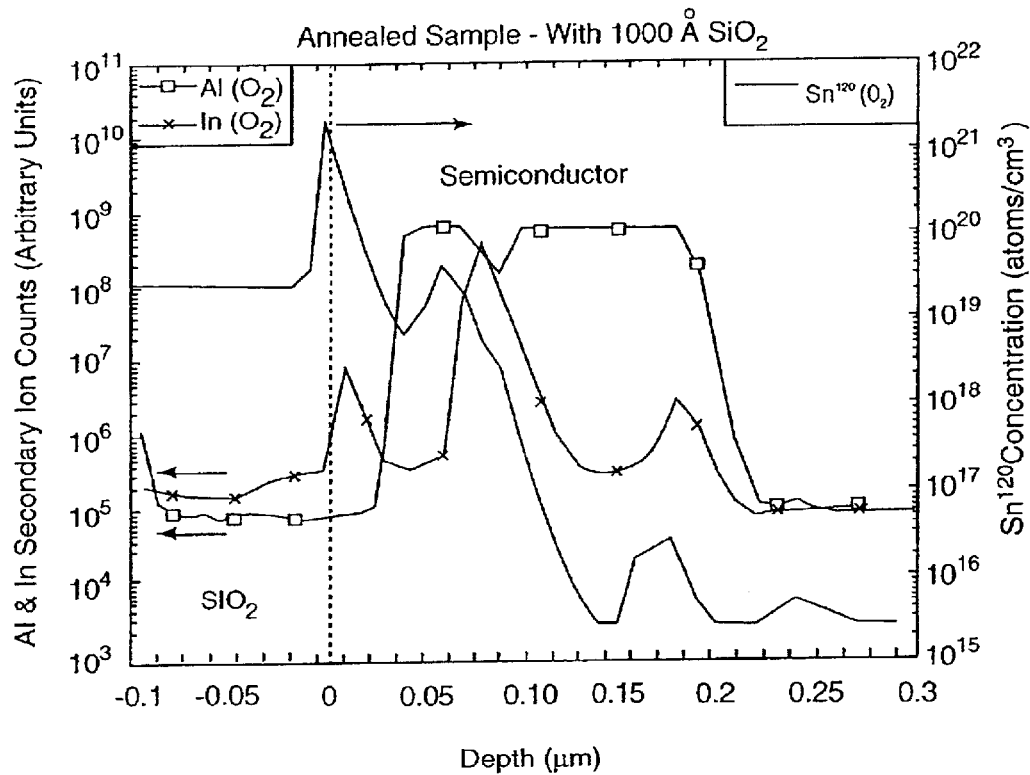

FIGS. 7A and 7B provide a comparison of SIMS data for an as-grown sample and a sample that was $SiO_2$ encapsulated and subsequently annealed. In particular, attention should be paid to the Sn depth profile. The SIMS data show that, for the $SiO_2$ encapsulated sample, the Sn has been drawn to the $SiO_2$/epilayer interface, where based on the Hall data it is inactive as a donor atom. In all likelihood, group III vacancies are "injected" at the $SiO_2$/epilayer interface to promote and foster Sn exchange and diffusion. The large size of the Sn atom and relatively weak bonds with the group V atoms probably make the Sn atoms more susceptible to exchange and diffusion interactions. The SIMS data also show that there is no observable difference in the Al and In profiles which gives further evidence that there is no intermixing occurring in the samples.

It is believed that this technique may well work with other group III–V semiconductors where the dopant is a group IV semiconductor having a larger size than the normal constituents of the group III–V semiconductors. As such, the group IV dopant should have an atomic number greater than the atomic numbers of either group III or group V semiconductors.

A brief discussion concerning intermixing at this point is very useful. Impurity induced intermixing and impurity free intermixing using $SiO_2$ encapsulant are well known in the prior art. The present invention is fundamentally different. The primary difference stems from the fact that the aim of intermixing, as performed by other researchers, is to selectively intermix different epilayers by displacing constituent atoms using $SiO_2$ encapsulation and subsequent annealing. As such, the anneal temperatures are necessarily very high (typically the effects become noticeable at 850° C.) and anneal times can be very long (more than 25 hours). In contrast, the present invention alters the Fermi potential without intentionally causing intermixing or other possibly deleterious effects on the lattice. As such, the anneal temperatures are comparatively quite low (approximately 600° C.) and anneal times are comparatively quite short (approximately 10 min or less).

Use of the "Etchless" Etch Technique in Making Other Semiconductor Devices

This technique performs the function of a gate recess etch in HEMTs and/or PHEMTs and/or MESFETs. FIG. 1G shows a PHEMT structure with a typical gate and channel recess etch. As mentioned above, there are several drawbacks to the standard technique for recess etching, including non-uniformity, non-planarity, and exposure of Al containing compounds to atmosphere. FIGS. 3A and 3B shows a PHEMT structure that is made by the etchless channel recess "etch" process which utilizes the aforementioned selective encapsulation with $SiO_2$ and subsequent annealing. As FIG. 3B shows, the process is planar or, if a double "etch" is utilized and the structure of FIG. 3A is obtained, then the process is very close to being planar. In either case the process does not expose the AlGaAs Schottky layer to air, which allows the dielectric passivation step used in the prior art to be eliminated.

Figure 8A:
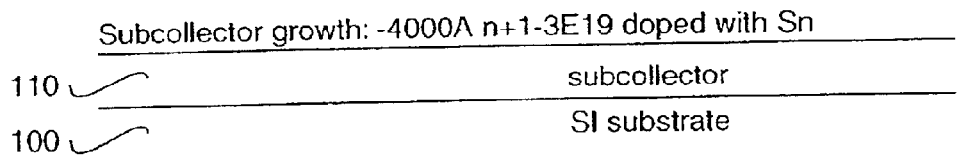
FIGS. 8A–8E depict the steps which may be used to manufacture a HBT device having reduced base-collector capacitance.
Figure 8B:
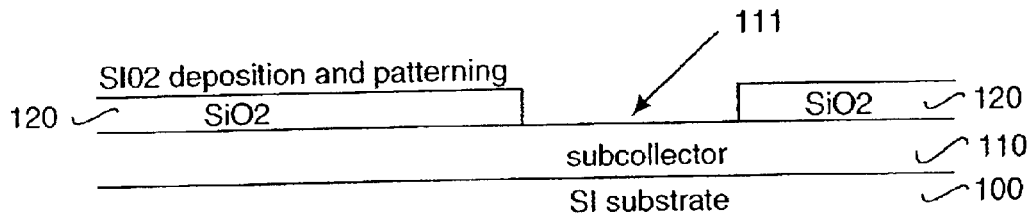
Figure 8C:
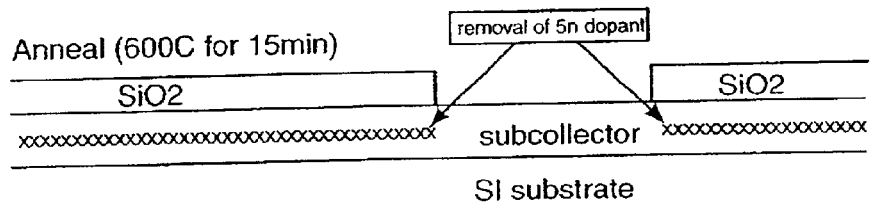

Other Applications for the Described Technique to Reduce or Control the Charge of a Semiconductor Layer The technique can be used to manufacture a Heterojunction Bipolar Transistor (HBT) device having a reduced base-collector capacitance ($C_{bc}$). The $C_{bc}$ is reduced by selectively removing electric charge underneath the device's external base contact by previously annealing $SiO_2$ capped Sn-doped layers to deplete or remove Sn as a donor. FIG. 8A depicts a semi-insulating InP substrate 100 upon which an InP layer 110, which will act as a subcollector, has been grown. The layer 110 is preferably about 4000 Å thick and is doped with Sn at a concentration preferably in the range of about $1*10^{19}$ to about $3*10^{19}$. Then $SiO_2$ is deposited and patterned as shown in FIG. 8B to form $SiO_2$ layer 120. A subsequent anneal is performed, preferably at about 600° C. for approximately 15 minutes, which leaches Sn atoms out of the InP layer 110 underlying $SiO_2$ layer 120. Sn atoms are not leached out of an adjacent location 111 in InP layer 110 which will become the subcollector. While most of layer 110 is shown as having been leached in FIG. 8C, the particular area from which the Sn atoms should be leached is the region of layer 110 underneath the yet to be formed base contact 145 (see FIG. 8E). Since Sn is not leached from those portions of the InP layer 110 which are not covered by $SiO_2$ layer 120, in the region which will serve as the subcollector 111, the carrier concentration provided by the Sn doping remains undiminished.

Figure 8D:
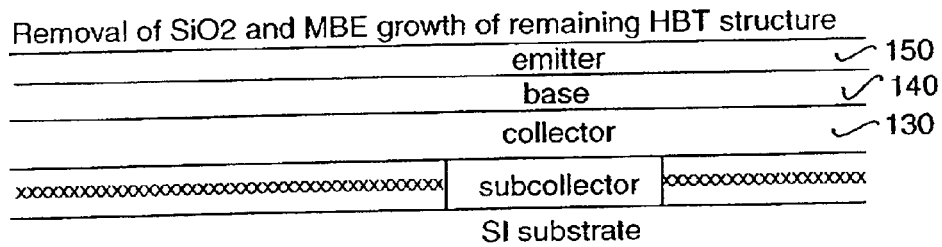
Figure 8E:
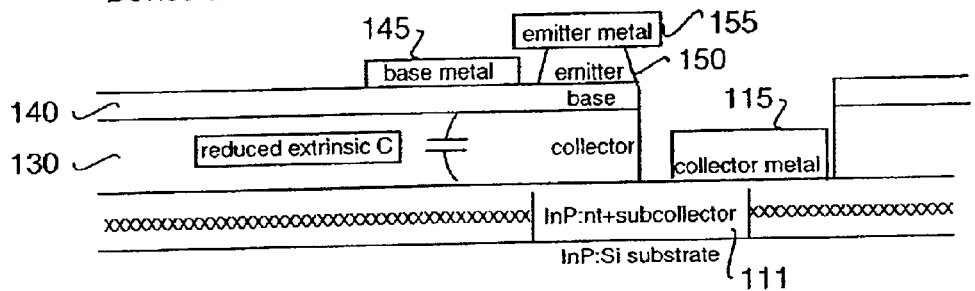

After removing the Sn atoms from the $SiO_2$-covered portions of the InP layer 110, the remainder of the HBT device is grown using conventional HBT manufacturing technology. Thus a collector 130, base 140 and emitter 150 layers are grown as shown in FIG. 8D and patterned as shown in FIG. 8E. Metal contacts are formed for the collector contact 115, a base contact 145 and an emitter contact 155.

Other group III–V semiconductors than InP may be used for layer 110 by some skilled in the art to form the subcollector. For example, GaInAs or another group III–V semiconductor may be substituted for InP in some applications. And while Sn is the preferred dopant due to its relatively large size, some may choose to use other dopants.

Figure 9A:
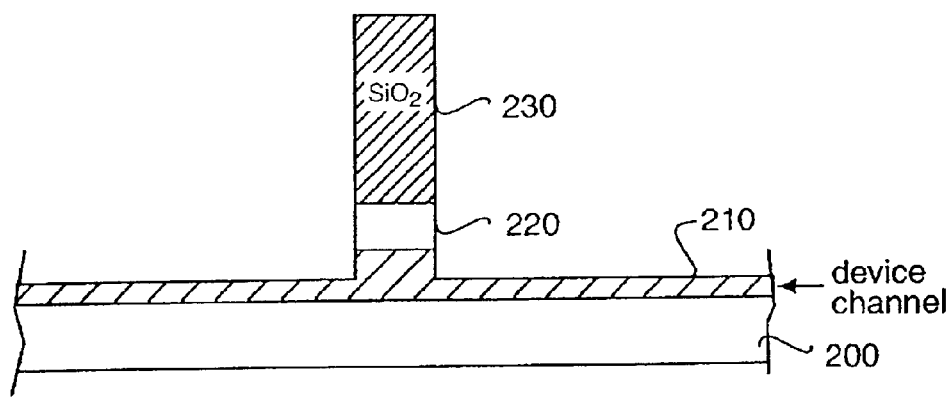
FIGS. 9A–9E depict the steps which may be used to manufacture an ultra-low power, enhancement mode HEMT device with a reduced charge cap over the device channel.

The described technique can also be used in the manufacture of ultra-low power, enhancement mode HEMT devices. FIG. 9A shows several layers grown on a substrate 200, including a device channel layer 210, a GaInAs cap layer 220 which is doped with Sn atoms and an $SiO_2$ layer 230, the layers having been patterned to define the desired gate dimension and then etched down and into the channel layer 210 to yield the structure shown in FIG. 9A.

Figure 9B:
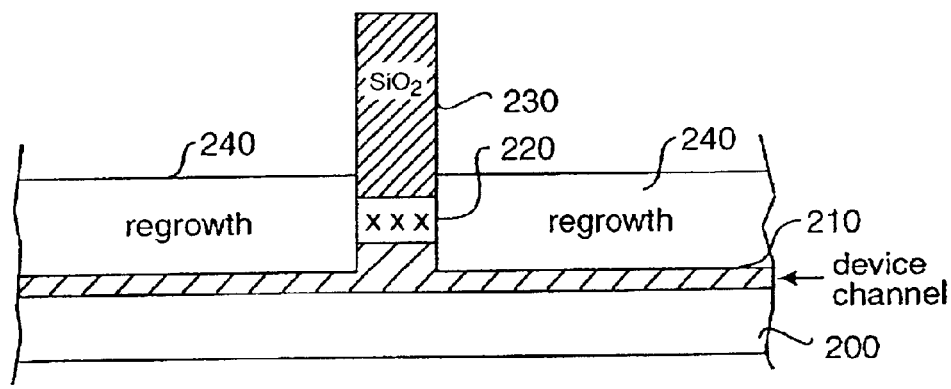

Using the remaining $SiO_2$ as a self-aligning mask, source and drain ohmic contacts 240 are selectively regrown as shown in FIG. 9B. Conveniently, the anneal, at preferably about 600° C., during the regrowth cycle also leaches Sn atoms out of the GaInAs cap 220 thereby reducing its charge (and hence its conductivity) and thereby setting the threshold voltage of the HEMT device being manufactured. The reduction of charge in GaInAs cap 220 is represented by the X's depicted in the GaInAs cap 220 of FIGS. 9B–9E.

Figure 9C:
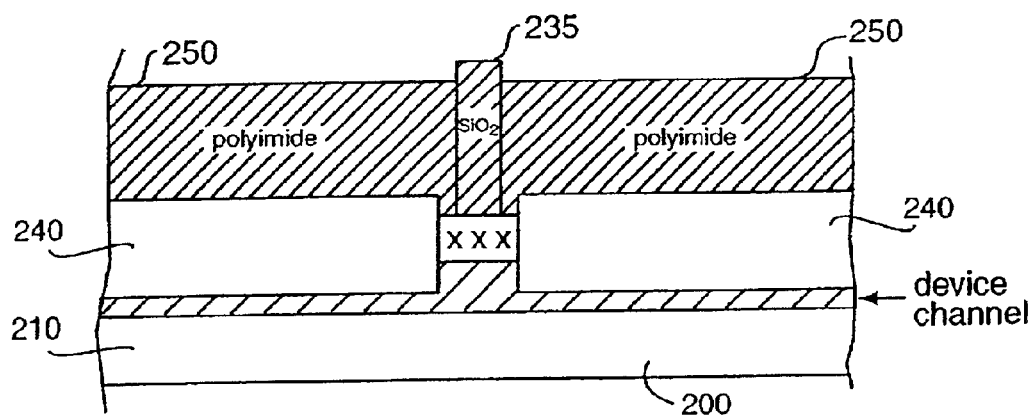
Figure 9D:
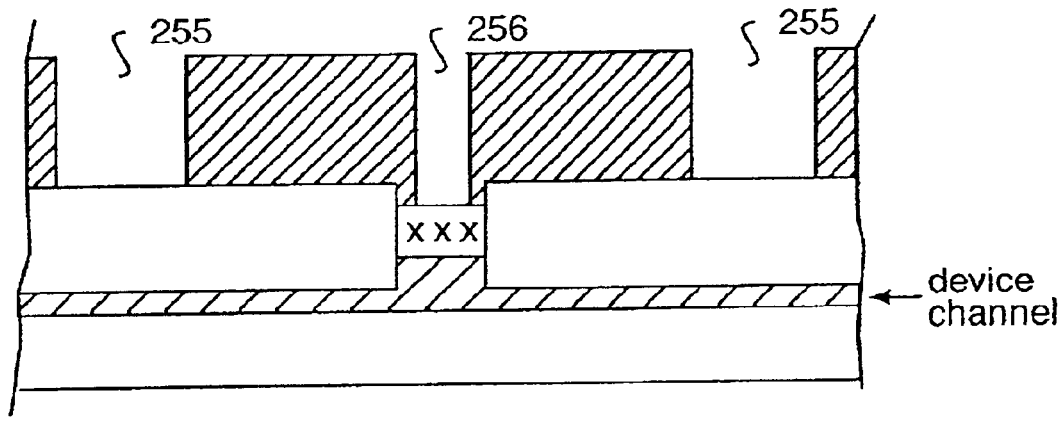
Figure 9E:
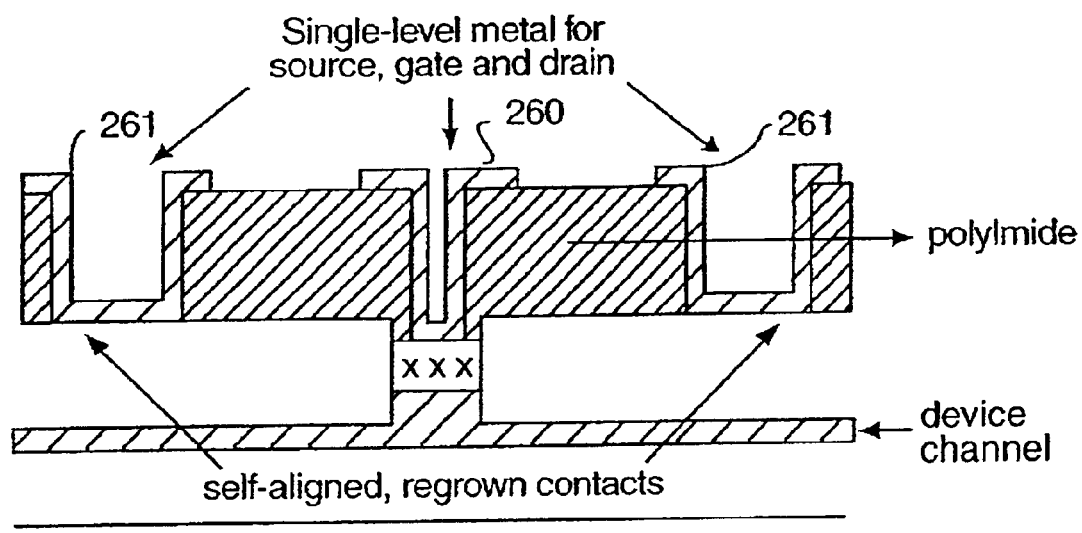

The $SiO_2$ layer 230, which actually appears more as a column since it is now higher than it is wide, is reduced in size by a blanket etch, preferably a Reactive Ion Etch (RIF), so that it is then spaced from the source and drain contacts 240 as can be seen in FIG. 9C. Polymide 250 is then spun and the resulting structure is planarized by etching the polymide back, leaving a tip 235 of the column 230 of $SiO_2$ exposed. Next the $SiO_2$ 230 is removed to define a gate contact via 256 and the polymide is patterned to define vias 255 for source and drain contacts, as shown in FIG. 9D. A metal gate contact 260 is formed in the gate via 256 and metal source and drain contacts 261 are formed in the vias 255. The removal of the $SiO_2$ column yields a self-aligned via 256 which is easily metalized to form the gate contact 260, which of course is also self-aligned. The lithography needed to form the source and drain vias 255 is not particularly critical and the gate, source and drains contacts 260, 261 can all be conveniently formed at the same time since no alloying is needed for the ohmic contacts formed thereby.

As should now be apparent to a person skilled in the art, there are likely many more applications for which reduction of conductivity/charge in a semiconductor layer using the present invention will prove to be very useful. The semiconductor may be InP, InGaAs, GaAs or some other group III–V semiconductor, while the dopant should have a relatively larger-sized atom. Sn is the preferred dopant.

Having described the invention with respect to a preferred embodiment of the invention, modification will now suggest itself to those skilled in the. As such, the invention is not to be limited to the disclosed embodiments, unless required by the appended claims.

What is claimed is:

1. A method of forming a gate region of a semiconductor device comprising the steps of:
   (a) forming a layer of semiconductor doped with Sn;
   (b) forming a region of $SiO_2$ on said semiconductor layer, the region of $SiO_2$ corresponding to said gate region;
   (c) annealing at least the semiconductor layer and the region of $SiO_2$ at a temperature sufficiently high to cause atoms of the Sn dopant to leach from the semiconductor layer into the region of $SiO_2$ and to thereby form a region in said $SiO_2$ layer having a reduced concentration of Sn dopant, the annealing step occurring at a temperature sufficiently low and for a period of time sufficiently short to inhibit significant intermixing between the region of $SiO_2$ and the semiconductor layer;
   (d) removing the region of $SiO_2$ after the annealing step is performed; and
   (e) forming a gate electrode on said semiconductor layer.

2. The method of claim 1 wherein the annealing step occurs at a temperature of approximately 600° C.

3. The method of claim 2 wherein the anneal time of the annealing step is approximately 10 minutes.

4. The method of claim 1 further including the step of etching a channel in the region in said $SiO_2$ layer having the reduced concentration of Sn dopant.

5. A method of reducing base-collector capacitance of a semiconductor device having a layer of a group III–V semiconductor which is doped with a group IV semiconductor, said method comprising the steps of:
   (a) forming a region of $SiO_2$ on said group III–V semiconductor layer;
   (b) annealing at least the semiconductor layer and the region of $SiO_2$ at a temperature sufficiently high to cause atoms of the group IV semiconductor to leach from at least a region of the group III–V semiconductor layer into the region of $SiO_2$;
   (c) removing the region of $SiO_2$ after the annealing step is performed; and
   (d) forming semiconductor layers defining a collector region and defining a base region over the region of the group III–V semiconductor layer from which the IV semiconductor was leached.

6. The method of claim 5 wherein the group III–V semiconductor is selected from semiconductor materials including Indium Phosphide (InP), Gallium Arsenide (GaAs) and Indium Gallium Arsenide (InGaAs) and the group IV semiconductor is Tin (Sn).

7. A method of making a HEMT device comprising the steps of:

(a) forming a device channel on a substrate;

(b) forming a cap layer of a group III–V semiconductor which is doped with a group IV semiconductor over said device channel;

(c) forming a region of $SiO_2$ on said group III–V semiconductor cap layer;

(d) annealing the semiconductor cap layer and the region of $SiO_2$ formed thereon at a temperature sufficiently high to cause atoms of the group IV semiconductor to leach from at least a region of the group III–V semiconductor cap layer into the region of $SiO_2$;

(e) forming self-aligned, regrowth contacts adjacent said semiconductor cap layer and adjacent the region of $SiO_2$;

(f) partially etching the region of $SiO_2$ after the regrowth contacts are formed;

(g) forming and patterning an insulating layer over the regrowth contacts and over exposed portions of the group III–V semiconductor cap layer;

(h) removing the partially etched region of $SiO_2$ after forming the insulating layer; and (i) forming metal contacts for the group III–V semiconductor cap layer and for the regrowth contacts.

8. The method of claim 7 wherein the group III–V semiconductor is Indium Phosphide (InP) or Indium Gallium Arsenide (InGaAs) or Gallium Arsenide (GaAs) and the group IV semiconductor is Tin (Sn).

* * * * *